United States Patent [19]

Murasawa

[11] Patent Number: 5,085,922
[45] Date of Patent: Feb. 4, 1992

[54] PRINTED CIRCUIT BOARD

[75] Inventor: Yasuhiro Murasawa, Itami, Japan

[73] Assignee: Mitsubishi Denki Kabushiki Kaisha, Japan

[21] Appl. No.: 526,844

[22] Filed: May 22, 1990

[51] Int. Cl.$^5$ .............................................. B32B 9/00
[52] U.S. Cl. ................................... 428/209; 428/251; 428/901; 357/70
[58] Field of Search ..................... 428/251, 209, 901; 357/70

[56] References Cited

U.S. PATENT DOCUMENTS 4,372,347  2/1983  Olson .................................. 139/420
4,563,385  1/1986  Bhatt et al. .......................... 428/251
4,833,005  5/1989  Klaar et al. ......................... 428/224

Primary Examiner—Patrick J. Ryan
Assistant Examiner—Kam F. Lee
Attorney, Agent, or Firm—Leydig, Voit & Mayer

[57] ABSTRACT

A printed circuit board includes a printed wiring board and a terminal board bonded to the printed wiring boards. These boards contain reinforcing fibers, and the directions of the reinforcing fibers in both boards are the same whereby coefficients of thermal expansion of both boards are substantially equal to each other. Thus, it is possible to prevent the circuit board from bending and to get a planar arrangement of electrode terminals in a case where the terminal board is bonded to the printed wiring board with solder.

8 Claims, 7 Drawing Sheets

PRINTED CIRCUIT BOARD

BACKGROUND OF THE INVENTION

1. Field of the Invention

The present invention relates to a printed circuit board, and more particularly to an improvement in a terminal part of a printed circuit board.

2. Description of the Prior Art

FIG. 1 is a perspective view showing a conventional semiconductor device card such as an IC board used for a game card, and FIG. 2 is a perspective view showing a part of the semiconductor device card in which a shutter is opened. FIG. 3 is a perspective view showing an internal constitution of the semiconductor device board, and FIG. 4 is a sectional view taken along line IV—IV of FIG. 2.

Referring to FIGS. 1 to 4, a semiconductor device card 1 comprises a card like package 2 formed by a frame 3 and a pair of outer panels 4. A printed circuit board 5 is affixed to the frame 3 so as to be contained in the package 2. The printed circuit board 5 comprises a printed wiring board 6 (see FIG. 5) and a terminal board 7 (see FIG. 6) bonded o the front end of the printed wiring board 6. A number of electrode terminals 8 are provided on the terminal board 7, and each electrode terminal 8 is electrically connected to a printed wiring 9 on the printed wiring board 5 through a contact hole 10 which is formed in the terminal board 7 as shown in FIG. 4. Semiconductor elements 11 are mounted on both surfaces of the printed wiring board 6.

At ordinary times, the electrode terminals 8 are covered with a shutter 12 as shown in FIG 1. The shutter 12 is urged toward the front end of the printed circuit board 5 by means of a spring (not shown) which is installed between the shutter 12 and the frame 3. When the card 1 is inserted in a charging hole of a connector of a card reader (not shown), shutter receiving pins 13 provided in the charging hole touch bent-down projections 14 provided at both sides of the shutter 12 and push the shutter 12 toward the rear end of the card i against the tension of the spring. Thus the electrode terminals 8 are exposed to contact shoes of the connector, so that the semiconductor elements 11 in the card 1 are electrically connected with the external card reader.

By the way, in a case where the semiconductor elements 11 are mounted only on one surface of the printed wiring board 6, the electrode terminals 8 may be directly formed on the printed wiring board 6, as shown in FIG. 7. However, in a case where the semiconductor elements 11 are mounted on both surfaces of the printed wiring board 6 as shown in FIG. 4, it is necessary to locate the printed wiring board 6 at a central position in the thickness direction of the frame 3. Therefore the electrode terminals 8 are formed on the terminal board 7 and are electrically connected to the printed wiring board 6 through the through holes 10.

In the above conventional printed circuit board 5, the terminal board 7 is bonded to the printed board 6 by solder, for example, as shown in FIG. 8. In this case, the difference between the coefficients of thermal expansion of the boards 6 and 7 causes the terminal boards 7 to bend, whereby the flat arrangement of the electrode terminals 8 is impaired.

SUMMARY OF THE INVENTION

The inventive printed circuit board comprises: (a) a printed wiring board including (1) a first insulating plate containing first reinforcing fibers and (2) printed wirings on the first insulating plate; and (b) terminal board including (1) a second insulating plate containing second reinforcing fibers and made of the same material as said first insulating plate, the second insulating plate being bonded on the printed wiring board, and (2) electrode terminals formed on the second insulating plate and electrically connected to the printed wirings the direction of the first reinforcing fibers being the same as the second reinforcing fibers.

Accordingly, a principal object of the present invention is to provide a printed circuit board which prevents a terminal board from bending to get a planar arrangement of electrode terminals.

According to the present invention, the first and second insulating plates are made of the same material and the directions of the first and second reinforcing fibers are the same, and therefore the coefficient of thermal expansion of the terminal board is equal to that of the printed wiring board. Thus it is possible to prevent the terminal board from bending when the terminal board is bonded on the printed wiring board.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
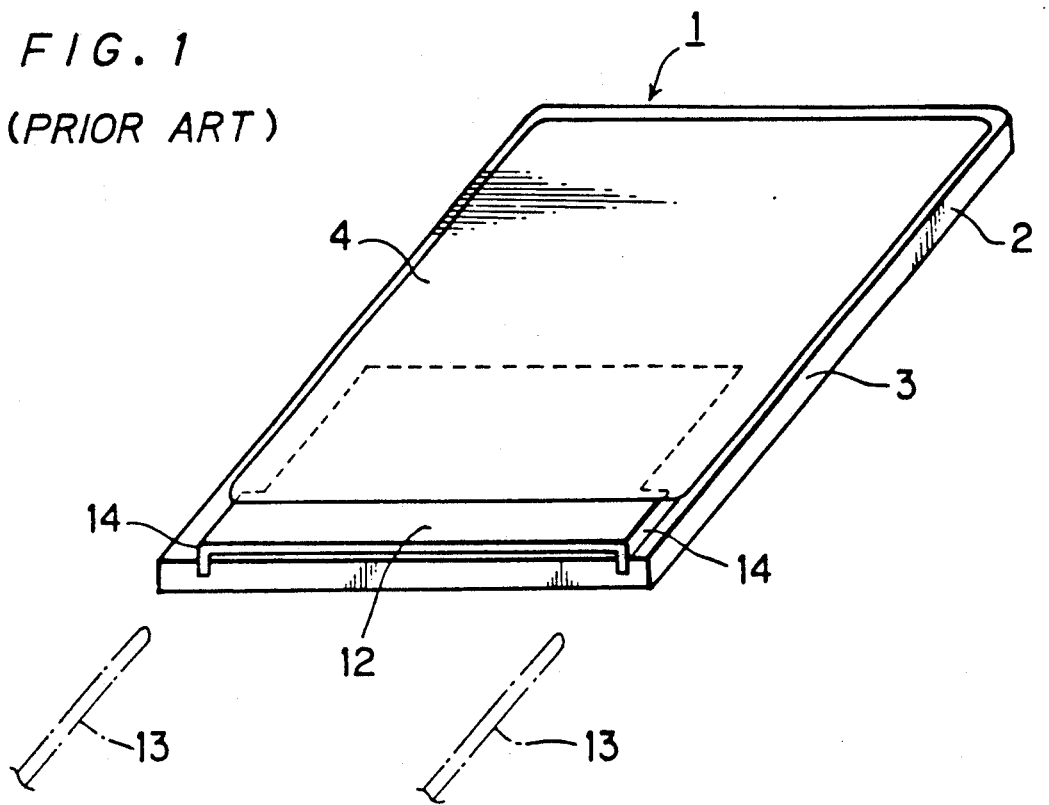
FIG. 1 is a perspective view showing a conventional semiconductor device card.
Figure 2:
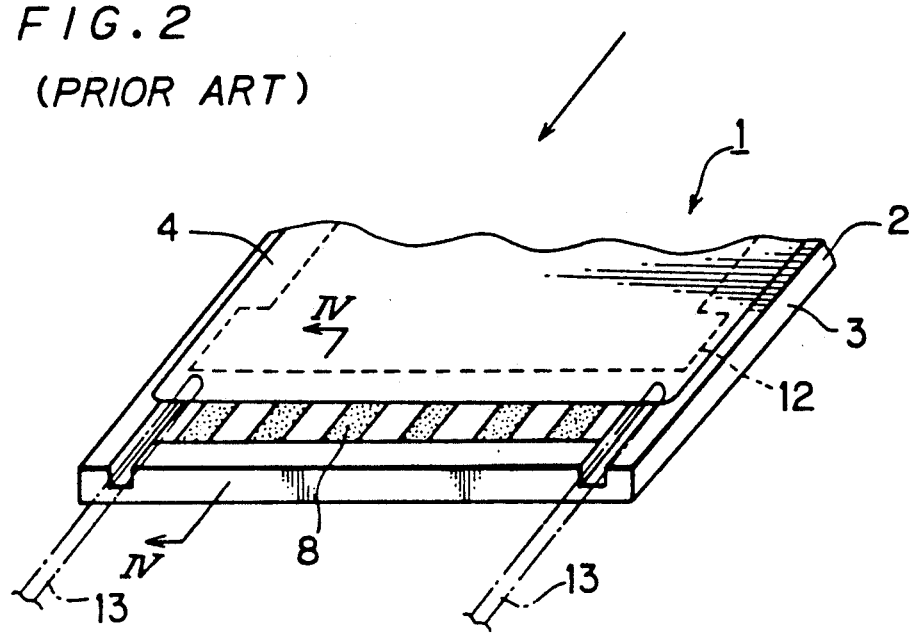
FIG. 2 is a perspective view showing a part of the semiconductor device card whose shutter is opened.
Figure 3:
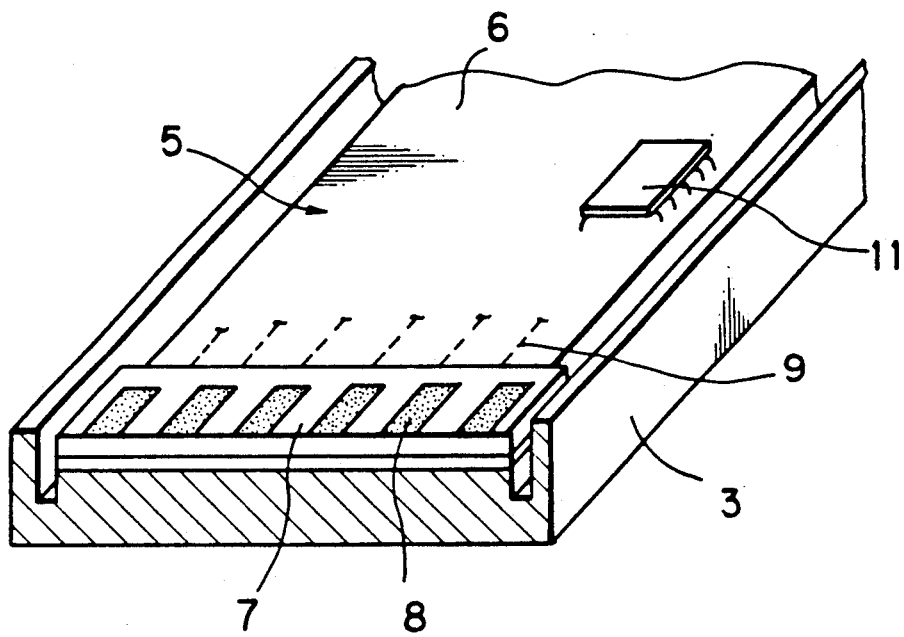
FIG. 3 is a perspective view showing an internal constitution of the semiconductor device card.
Figure 4:
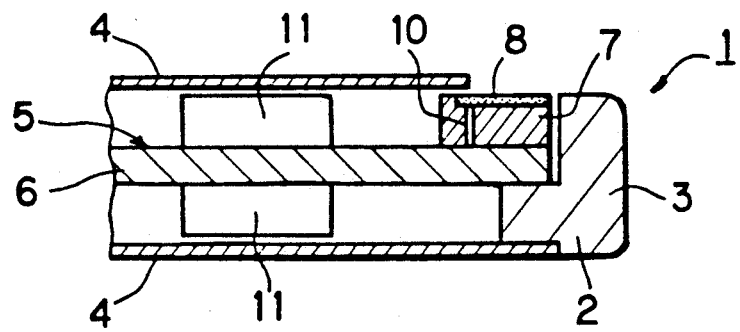
FIG. 4 is a sectional view taken along line IV—IV of FIG. 2.
Figure 7:
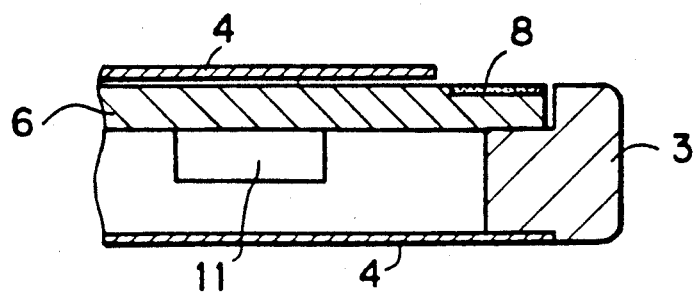
FIG. 7 is a sectional view showing a semiconductor device card in a case where a semiconductor element is mounted on one surface of a printed wiring board.
Figure 5:
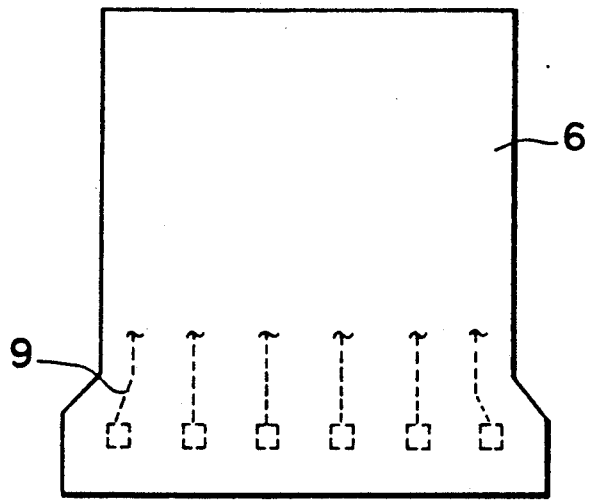
FIG. 5 is a plan view of a printed wiring board.
Figure 6:
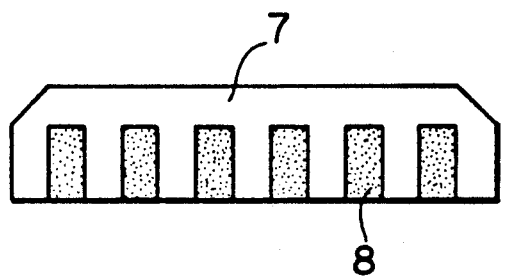
FIG. 6 is a plan view of a terminal board.
Figure 8:
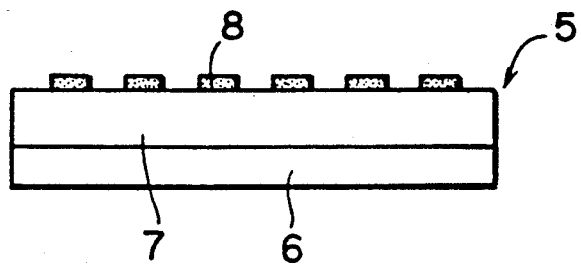
FIG. 8 is a side view of a printed circuit board.
Figure 9:
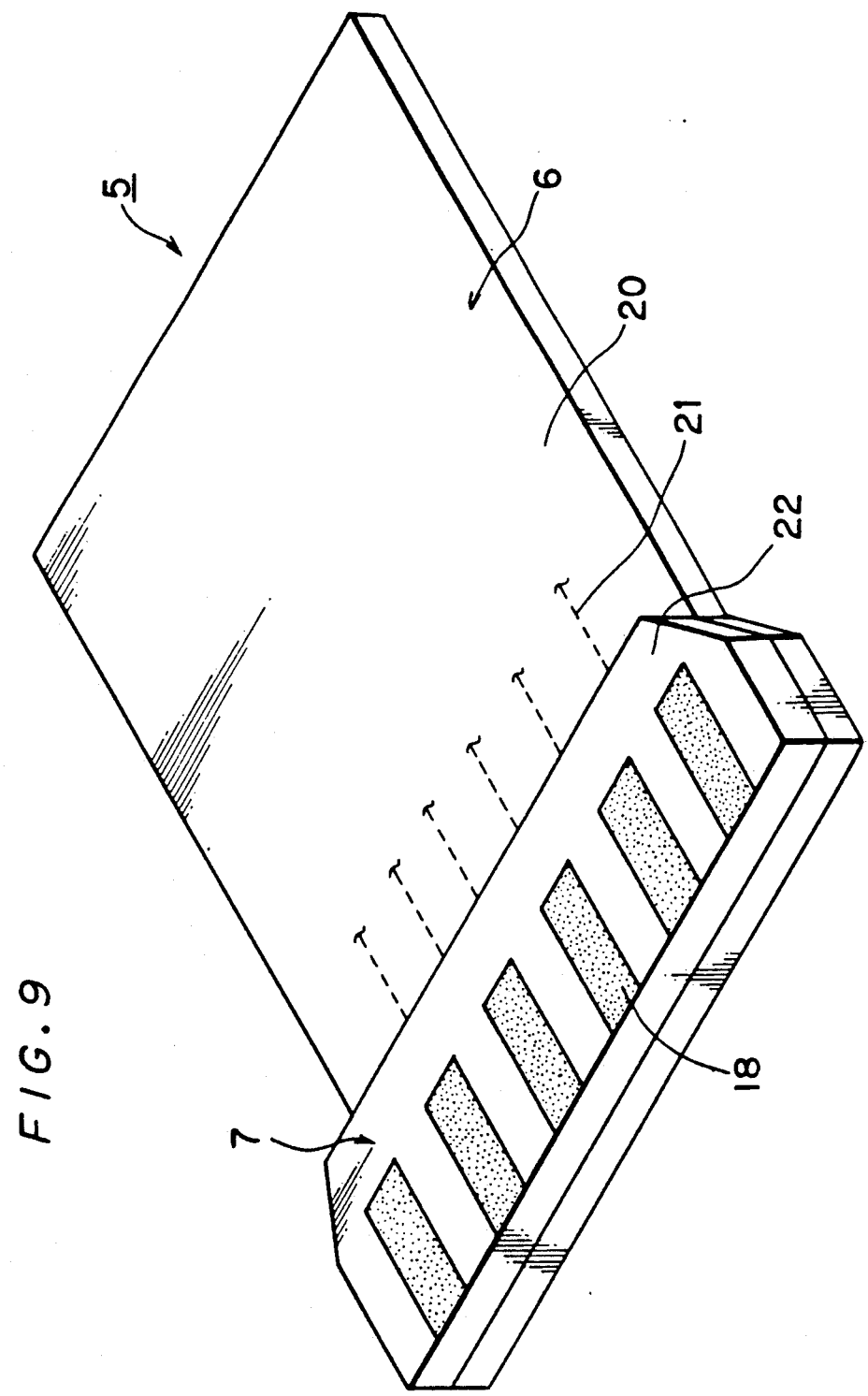
FIG. 9 is a perspective view of an embodiment of a printed circuit board according to the present invention.

FIG. 9 is a perspective view of an embodiment of a printed circuit board according to the present invention.

Figure 10:
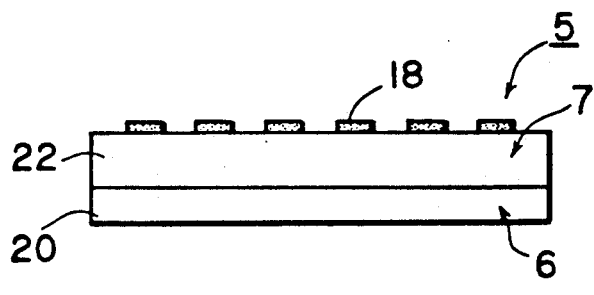
FIG. 10 is a side view of the printed circuit board of FIG. 9.

FIG. 10 is a side view of the printed circuit board, and

Figure 11:
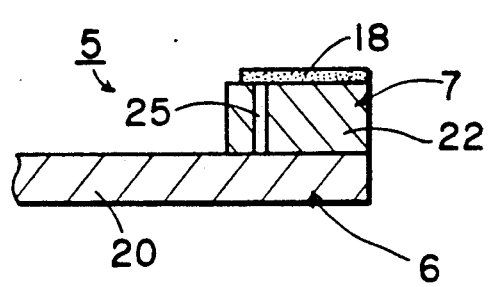
FIG. 11 is a sectional view of the printed circuit board of FIG. 9.

FIG. 11 is a sectional view of the printed circuit board.

Referring to FIGS. 9 to 11, a printed circuit board 5 comprises a printed wiring board 6 and a terminal board 7 bonded on the front end of the printed wiring board 6.

Figure 12:
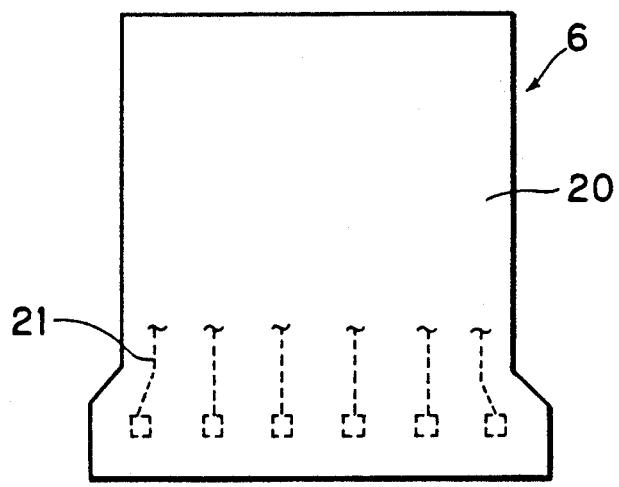
FIG. 12 is the plan view of a printed wiring board of FIG. 9.

The printed wiring board 6 includes a first insulating plate 20 and printed wiring 21 formed on the first insulating plate 20, as shown in FIG. 12, which is a plan view of the printed wiring board 6.

Figure 13:
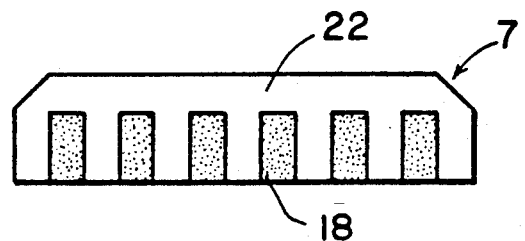
FIG. 13 is a plan view of a terminal board of FIG. 9.

The terminal board 7 includes a second insulating plate 22 and electrode terminals 18 formed on the second insulating plate 22, as shown in FIG. 13, which is a plan view of the terminal board 7.

The first and second insulating plates 20 and 22 are made of the same material with each other and contain reinforcing fibers such as glass fibers. These plates 20 and 22 are made by combining a thermosetting resin such as a phenolic resin, a epoxy resin and so on, with one or more glass fiber fabrics, for example.

Figure 15:
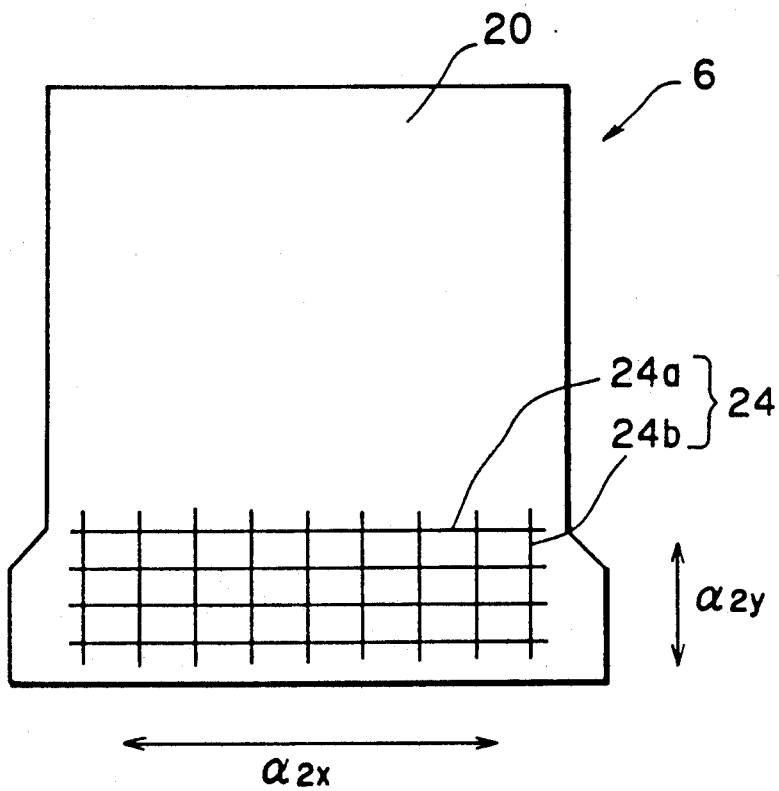
FIG. 15 is a plan view of the printed wiring board showing relations between the direction of reinforcing fibers and coefficients of thermal expansion.
Figure 14:
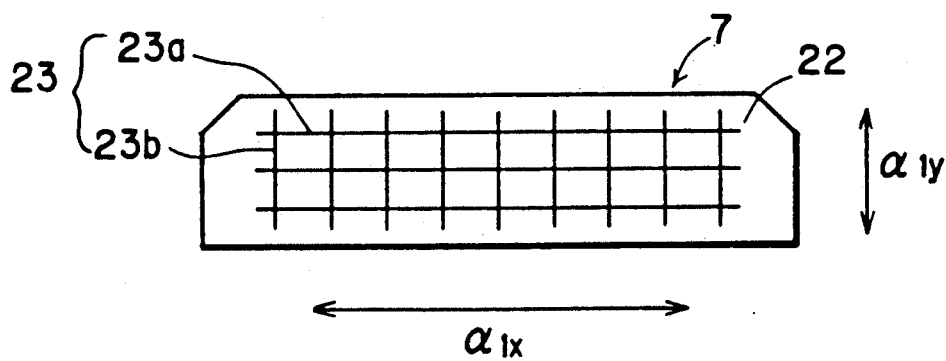
FIG. 14 is a plan view of a terminal board showing relations between the direction of reinforcing fibers and coefficients of thermal expansion.

FIG. 14 is a plan view of the terminal board showing relations between a direction of the reinforcing fibers and a horizontal coefficient of thermal expansion $\alpha_{1x}$, a vertical coefficient of thermal expansion $\alpha_{1y}$. FIG. 15 is a plan view of the printed wiring board showing relations between a direction of the reinforcing fibers and a horizontal coefficient of thermal expansion $\alpha_{2x}$, a vertical coefficient of thermal expansion $\alpha_{2y}$.

Reinforcing fibers 23 of the terminal board 7 consist of weft fibers 23a and warp fibers 23b, as shown in FIG. 14, while reinforcing fibers 24 of the printed wiring board 6 consist of weft fibers 24a and warp fibers 24b, as shown in FIG. 15.

The terminal board 7 is bonded on the printed wiring board 6 by solder as shown in FIG. 10 and 11, whereby the electrode terminals 8 are electrically connected to the printed wiring 21 through the through holes 25 which are formed in the second insulating plate 22. In this case, the terminal board 7 is bonded on the printed wiring board 6 so that the directions of the weft and warp fibers 23a and 23b are the same as the weft and warp fibers 24a and 24b, respectively.

The function of the printed circuit board 5 will be described below.

Figure 16:
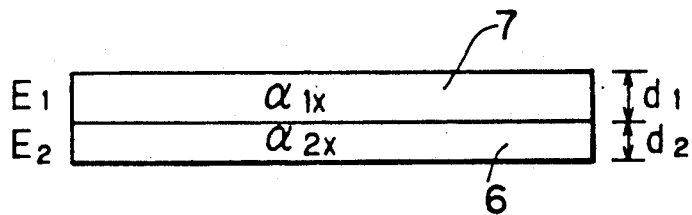
FIG. 16 is a side view of the printed circuit board for explaining thickness, coefficients of thermal expansion and modulus of longitudinal elasticity.

When the terminal board 7 is bonded to the printed wiring board 6 by the solder, the temperature of a connecting part of both boards 6 and 7 rises at least to that of the fusing point of the solder. Now, consider a case where the boards 6 and 7 are bonded at temperature $(T+\Delta T)$ with respect to a room temperature T and thereafter the temperature of the bonding part drops to room temperature T. If the directions of the reinforcing fibers 2S and 24 of the boards 6 and 7 are random relative to each other, the boards 6 and 7 will bend gradually as the temperature drops, since the boards 6 and 7 form a bimetallic type construction. In this case, a curvature $\rho$ of the boards 6 and 7 is given by the following equation which is an equation for a bimetal:

$$\frac{1}{\rho} = \frac{6(1+m)^2(\alpha_{2x} - \alpha_{1x})}{3(1+m)^2 + (1+mn)\left(m^2 + \frac{1}{mn}\right)} \cdot \frac{\Delta T}{h} \quad (1)$$

$$\left(m = \frac{d_1}{d_2}, n = \frac{E_1}{E_2}, h = d_1 + d_2\right)$$

where $d_1$ indicates the thickness of the terminal board, $d_2$ is the thickness of the printed wiring board, $E_1$ is the modulus of longitudinal elasticity of the terminal board, and $E_2$ is the modulus of longitudinal elasticity of the printed wiring board, as shown in FIG. 16.

Figure 17:
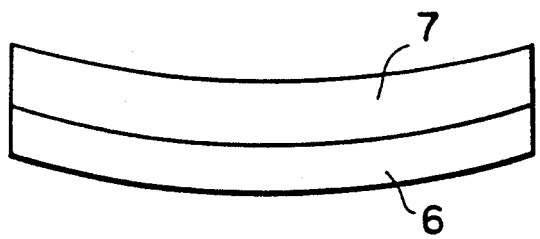
FIGS. 17 to 19 are side views for explaining the respectively.
Figure 18:
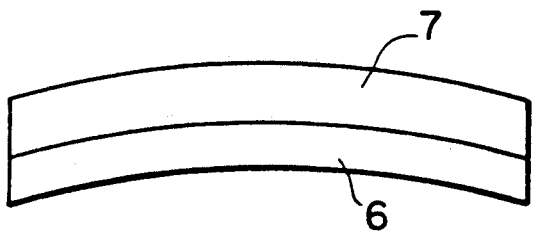

As is apparent from the above equation (1), the larger the difference between the coefficients of thermal expansion of the boards 6 and 7, the more both boards 6 and 7 bend, whereby the flat arrangement of the electrode terminals 23 is impaired. FIG. 17 is a side view showing bending of both boards 6 and 7 when the horizontal coefficient of thermal expansion $\alpha_{1x}$ is larger than the horizontal coefficient of thermal expansion $\alpha_{2x}$, while FIG. 18 is a side view showing bending of both boards 6 and 7 when the horizontal coefficient of thermal expansion $\alpha_{2x}$ is larger than the horizontal coefficient of thermal expansion $\alpha_{1x}$.

Figure 19:
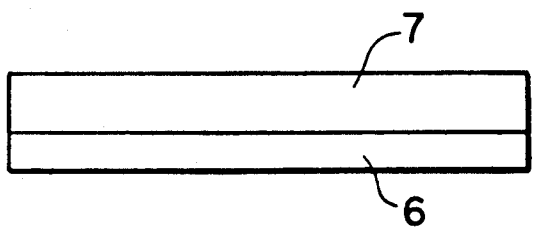

In the above embodiment, however, the first and second insulating plates 20 and 22 of the boards 6 and 7 are made of the same material and the directions of the weft and warp fibers 23a and 23b are the same as those of the weft and warp fibers 24a and 24b, respectively, and therefore the horizontal and vertical coefficients of thermal expansion $\alpha_{1x}$ and $\alpha_{1y}$ are substantially equal to the horizontal and vertical coefficients of thermal expansion $\alpha_{2x}$ and $\alpha_{2y}$, respectively. As a result, in a case where the terminal board 6 is bonded to the printed wiring board 7 with solder, for example, it is possible to prevent both boards 6 and 7 from bending to get a flat arrangement of the electrode terminals 23 as shown in FIG. 19.

Besides, it is preferable that the horizontal coefficients of thermal expansion $\alpha_{1x}$ and $\alpha_{2x}$ are smaller than the vertical coefficients of thermal expansion $\alpha_{1y}$ and $\alpha_{2y}$, respectively.

The printed circuit board 5 thus formed is assembled into a package to form an IC card, for example.

In the above embodiment, although the reinforcing fibers 23 and 24 are provided along two directions respectively, these may be provided along one direction or three or more directions respectively.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A printed circuit board comprising:
   (a) a printed wiring board including
      (1) a first insulating plate containing first reinforcing fibers lying along a first direction, and
      (2) printed wiring formed on said first insulating plate; and
   (b) a terminal board including
      (1) a second insulating plate containing second reinforcing fibers lying along a second direction and made of the same material as said first insulating plate, said second insulating plate being bonded to said printed wiring board, and (2) electrode terminals formed on said second insulating plate and electrically connected to said printed wiring, wherein the first and second directions are in substantial parallel alignment.

2. A printed circuit board in accordance with claim 1 wherein said first reinforcing fibers comprise first warp fibers and first weft fibers, while second reinforcing fibers comprise second warp fibers and second weft fibers, said first warp fibers being aligned with said second warp fibers and said first weft fibers being aligned with said second weft fibers where the first and second fibers are made of the same materials, respectively.

3. A printed circuit board in accordance with claim said first reinforcing fibers and second reinforcing fibers are glass fibers.

4. A printed circuit board in accordance with claim 1 wherein said insulating plate is bonded to said printed wiring board with solder.

5. A printed circuit board in accordance with claim 2 wherein said first reinforcing fibers and second reinforcing fibers are glass fibers.

6. A printed circuit board comprising:

(a) a printed wiring board including a first insulating plate containing first reinforcing fibers lying along a first direction and possessing a first coefficient of thermal expansion, second fibers lying along a second direction possessing a second coefficient thermal expansion and printed wiring formed on said first insulating plate; and (b) a terminal board including a second insulating plate bonded to said printed wiring board, said second insulating plate containing a third set of reinforcing fibers lying substantially along said first direction, said third set of reinforcing fibers having a coefficient of thermal expansion substantially equal to the coefficient of thermal expansion of said first fibers, a fourth set of reinforcing fibers lying substantially along said second direction where said fourth set of reinforcing fibers possess a coefficient of thermal expansion substantially equivalent to that of said second set of reinforcing fibers, and electrode terminals formed on said second insulating plate and electrically connected to said printed wiring wherein said second set of reinforcing fibers have a coefficient of thermal expansion which is larger than that of the first set of reinforcing fibers whereby said terminal board and printed wiring board are prevented from bending in response to temperature changes and said electrode terminals are maintained in a substantially planar configuration during temperature changes.

7. A printed circuit board in accordance with claim 6 wherein said first and third reinforcing fibers comprise warp fibers and said second and fourth reinforcing fibers comprise weft fibers, said first warp fibers being aligned with said second warp fibers and said first weft fibers being aligned with said second weft fibers where the first and third fibers and the second and fourth fibers are made of the same materials, respectively.

8. A printed circuit board comprising:

a printed wiring board, a terminal board, electrode terminals on said terminal board and electrically connected to said printed wiring board, and means for preventing said terminal board from bending relative to said printed wiring board and maintaining said electrode terminals in a substantially planar configuration, said means including first reinforcing fibers lying along a first direction in said printed wiring board and said terminal board and second reinforcing fibers lying along a second direction in said printed wiring board and terminal board, said first reinforcing fibers having a coefficient of thermal expansion smaller than the coefficients of thermal expansion of said second reinforcing fibers wherein said second reinforcing fibers are substantially perpendicular to said first reinforcing fibers in said printed wiring board and said terminal board.

* * * * *